(12) United States Patent
Zhang

(10) Patent No.: US 12,144,207 B2
(45) Date of Patent: Nov. 12, 2024

(54) OLED DISPLAY PANEL AND METHOD OF MANUFACTURING SAME

(71) Applicant: SHENZHEN CHINA STAR OPTOELECTRONICS SEMICONDUCTOR DISPLAY TECHNOLOGY CO., LTD., Shenzhen (CN)

(72) Inventor: Letao Zhang, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 323 days.

(21) Appl. No.: 17/252,277

(22) PCT Filed: Nov. 18, 2020

(86) PCT No.: PCT/CN2020/129745
§ 371 (c)(1),
(2) Date: Dec. 15, 2020

(87) PCT Pub. No.: WO2022/073284
PCT Pub. Date: Apr. 14, 2022

(65) Prior Publication Data
US 2022/0352275 A1    Nov. 3, 2022

(30) Foreign Application Priority Data
Oct. 10, 2020   (CN) .......................... 202011077969.0

(51) Int. Cl.
*H01L 27/32* (2006.01)
*H01L 51/52* (2006.01)
(Continued)

(52) U.S. Cl.
CPC ......... *H10K 59/124* (2023.02); *H10K 50/818* (2023.02); *H10K 50/88* (2023.02);
(Continued)

(58) Field of Classification Search
CPC ............ H01L 27/3258; H01L 27/3246; H10K 59/124; H10K 59/1216; H10K 50/80–828; H10K 50/88; H10K 59/80–82
See application file for complete search history.

(56) References Cited

U.S. PATENT DOCUMENTS

| 10,068,924 B2 | 9/2018 | Tsai | |
| 2004/0135937 A1* | 7/2004 | Lee | G02F 1/133514 349/106 |

(Continued)

FOREIGN PATENT DOCUMENTS

| CN | 1734542 A | * | 2/2006 | ........... G09G 3/3233 |
| CN | 102629046 A | * | 8/2012 | ........... G02F 1/1362 |

(Continued)

OTHER PUBLICATIONS

Machine translation, Gong, Chinese Pat. Pub. No. CN-110335970-A, translation date: Dec. 17, 2022, Espacenet, all pages. (Year: 2022).*

(Continued)

*Primary Examiner* — Victoria K. Hall
(74) *Attorney, Agent, or Firm* — PV IP PC; Wei Te Chung

(57) ABSTRACT

An organic light-emitting diode (OLED) display panel and a method of manufacturing the same are disclosed. The OLED display panel includes a base substrate and a plurality of film layers sequentially deposited on a side of the base substrate in a stacked arrangement in a first direction. The plurality of film layers includes a first planarization layer configured to initially planarize an array substrate, and a
(Continued)

second planarization layer configured to further planarize the array substrate. The first planarization layer and the second planarization layer are made of different materials.

2 Claims, 6 Drawing Sheets

(51) Int. Cl.
| | | |
|---|---|---|
| *H01L 51/56* | (2006.01) | |
| *H10K 50/818* | (2023.01) | |
| *H10K 50/88* | (2023.01) | |
| *H10K 59/121* | (2023.01) | |
| *H10K 59/124* | (2023.01) | |
| *H10K 59/126* | (2023.01) | |
| *H10K 71/00* | (2023.01) | |
| *H10K 59/12* | (2023.01) | |
| *H10K 59/80* | (2023.01) | |
| *H10K 77/10* | (2023.01) | |
| *H10K 102/00* | (2023.01) | |

(52) U.S. Cl.
CPC ....... *H10K 59/1216* (2023.02); *H10K 59/126* (2023.02); *H10K 71/00* (2023.02); *H10K 59/1201* (2023.02); *H10K 59/80518* (2023.02); *H10K 71/621* (2023.02); *H10K 77/111* (2023.02); *H10K 2102/351* (2023.02)

(56) References Cited

U.S. PATENT DOCUMENTS

| | | | | |
|---|---|---|---|---|
| 2009/0295280 | A1* | 12/2009 | Yang | H10K 50/865 |
| | | | | 257/E51.024 |
| 2016/0020422 | A1* | 1/2016 | Kim | H10K 50/824 |
| | | | | 257/40 |
| 2016/0351846 | A1* | 12/2016 | Kim | H10K 50/84 |
| 2017/0194395 | A1* | 7/2017 | Hu | H01L 51/0005 |
| 2018/0182836 | A1* | 6/2018 | Beak | H10K 59/1216 |
| 2019/0074338 | A1* | 3/2019 | Gu | H01L 27/3258 |
| 2019/0088892 | A1* | 3/2019 | Zhang | H01L 51/56 |
| 2019/0355799 | A1* | 11/2019 | Jeong | H01L 27/3262 |
| 2020/0411619 | A1* | 12/2020 | Huang | H10K 59/124 |
| 2021/0036075 | A1* | 2/2021 | Wang | H01L 51/5234 |
| 2021/0159288 | A1* | 5/2021 | Lee | H10K 50/865 |
| 2021/0217839 | A1* | 7/2021 | Choi | H10K 59/123 |
| 2021/0249486 | A1* | 8/2021 | Lee | H10K 59/126 |
| 2021/0328194 | A1* | 10/2021 | Song | H01L 51/5218 |
| 2022/0115448 | A1* | 4/2022 | Zhang | H10K 59/131 |

FOREIGN PATENT DOCUMENTS

| | | | | |
|---|---|---|---|---|
| CN | 106094354 | A | | 11/2016 |
| CN | 107394060 | A | | 11/2017 |
| CN | 108470844 | A | | 8/2018 |
| CN | 109031742 | A | | 12/2018 |
| CN | 109148521 | A * | 1/2019 | ......... H01L 24/3244 |
| CN | 110335970 | A * | 10/2019 | ......... H01L 27/3244 |
| CN | 110346988 | A | | 10/2019 |
| CN | 110400810 | A | | 11/2019 |
| CN | 111261642 | A * | 6/2020 | ............... G09F 9/33 |

OTHER PUBLICATIONS

Machine translation, Jian, Chinese Pat. Pub. No. CN-102629046-A, translation date: Dec. 17, 2022, Espacenet, all pages. (Year: 2022).*
Machine translation, Jiang, Chinese Pat. Pub. No. CN-109148521-A, translation date: Dec. 17, 2022, Espacenet, all pages. (Year: 2022).*
Machine translation, Peng, Chinese Pat. Pub. No. CN-111261642-A, translation date: Dec. 17, 2022, Espacenet, all pages. (Year: 2022).*
Translation, International Search Report, International Search Authority, International application No. PCT/CN2020/129745, Jun. 25, 2021, all pages. (Year: 2021).*
Written Opinion of International Search Authority, International Search Authority, International application No. PCT/CN2020/129745, Jun. 25, 2021, all pages. (Year: 2021).*
Machine translation (Google translate), Written Opinion of International Search Authority, International Search Authority, International application No. PCT/CN2020/129745, Jun. 25, 2021, all pages. (Year: 2021).*
Machine translation, Ju, Chinese Pat. Pub. No. CN-1734542-A, translation date: Dec. 28, 2022, Espacenet, all pages. (Year: 2022).*
International Search Report in International application No. PCT/CN2020/129745, mailed on Jun. 25, 2021.
Written Opinion of the International Searching Authority in International application No. PCT/CN2020/129745, mailed on Jun. 25, 2021.
Chinese Office Action in corresponding Chinese Patent Application No. 202011077969.0 dated Aug. 2, 2022, pp. 1-7.

* cited by examiner

OLED DISPLAY PANEL AND METHOD OF MANUFACTURING SAME

RELATED APPLICATIONS

This application is a National Phase of PCT Patent Application No. PCT/CN2020/129745 having international filing date of Nov. 18, 2020, which claims the benefit of priority of Chinese Patent Application No. 202011077969.0 filed on Oct. 10, 2020. The contents of the above applications are all incorporated by reference as if fully set forth herein in their entirety.

BACKGROUND OF INVENTION

1. Field of Invention

The present invention relates to a technical field of displays, and particularly to, an organic light-emitting diode display panel and a method of manufacturing the same.

2. Related Art

With vigorous development of active-matrix organic light-emitting diode (AMOLED) display technology, bottom-emission type white OLEDs are currently mass-produced products of AMOLED technology. However, such technology uses vapor deposition to prepare OLED devices, which wastes a lot of organic light-emitting materials. Besides, white OLEDs need color filter substrates to filter colors to exhibit RGB, so their energy consumption is not superior to traditional liquid crystal display panels. In addition, bottom emitting structures have low aperture ratios as an innate defect, which is not good for high-resolution display applications. Compared with bottom-emission type white OLEDs, top-emission inkjet printing (IJP) technology has a raw material utilization rate of more than 80%, and is capable of emitting RGB color light without color filter substrates, as well as being beneficial to increase aperture ratios. However, there are high requirements on flatness of backplates for regular top-emission IJP technologies, and a planarization layer is generally used to fill in unevenness caused by components and wirings. As users' requirements for display panel resolution, aperture rates, and refresh frequencies are gradually increasing, requirements for metal trace resistance are also getting higher and higher, resulting in a gradual increase in metal trace thickness. Unfortunately, flattening effects provided by the planarization layer are limited.

Therefore, it is imperative to overcome a problem in current OLED display panel technologies that the limited flatness of the existing planarization layers cannot satisfy high requirements on flatness of backplates for regular top-emission IJP technologies.

SUMMARY OF INVENTION

An object of the present disclosure is to provide an organic light-emitting diode (OLED) display panel and a method of manufacturing the same to overcome a problem that the limited flatness of the existing planarization layers cannot satisfy high requirements on flatness of backplates for regular top-emission IJP technologies.

In order to achieve the above-mentioned object, the present application provides a technical solution as follows:

The present application provides an organic light-emitting diode (OLED) display panel, comprising a base substrate and a plurality of film layers sequentially deposited on a side of the base substrate in a stacked arrangement in a first direction; wherein the plurality of film layers comprise a first planarization layer configured to initially planarize an array substrate; and a second planarization layer configured to further planarize the array substrate, wherein the first planarization layer and the second planarization layer comprise different materials, and the base substrate is one of a glass substrate or a flexible substrate.

In one embodiment provided by the present application, a material of the first planarization layer is one of a polyimide (PI)-based organic material or acrylic-based organic material, and a material of the second planarization layer is a siloxane-based organic photoresist material.

In one embodiment provided by the present application, the second planarization layer comprises components containing carbon, silicon, oxygen, and hydrogen.

In one embodiment provided by the present application, the first planarization layer has a predetermined thickness defined as a first thickness in a first direction, and the second planarization layer has a predetermined thickness defined as a second thickness in the first direction.

In one embodiment provided by the present application, the first thickness ranges from 1 micron (μm) to 2.5 μm, and the second thickness ranges from 1 μm to 2.5 μm.

In one embodiment provided by the present application, the OLED display panel further comprises a passivation layer disposed on a side of the planarization layer adjacent to the base substrate, wherein the passivation layer is made of a material comprising one or a combination of silicon oxide, silicon nitride, or aluminum oxide.

In one embodiment provided by the present application, the OLED display panel further comprises an anode layer disposed on a side of the second planarization layer facing away from the base substrate, wherein the anode layer has a structure comprising one of indium tin oxide (ITO)/silver (Ag)/ITO, Ag/ITO, aluminum (Al)/tungsten oxide (WOx), or Ag/indium zinc oxide (IZO).

The present application further provides an organic light-emitting diode (OLED) display panel, comprising a base substrate and a plurality of film layers sequentially deposited on a side of the base substrate in a stacked arrangement in a first direction; wherein the plurality of film layers comprise a first planarization layer configured to initially planarize an array substrate; and a second planarization layer configured to further planarize the array substrate, wherein the first planarization layer comprises a material different from a material of the second planarization layer.

In one embodiment provided by the present application, a material of the first planarization layer is one of a polyimide (PI)-based organic material or acrylic-based organic material, and a material of the second planarization layer is a siloxane-based organic photoresist material.

In one embodiment provided by the present application, the second planarization layer comprises components containing carbon, silicon, oxygen, and hydrogen.

In one embodiment provided by the present application, the first planarization layer has a predetermined thickness defined as a first thickness in a first direction, and the second planarization layer has a predetermined thickness defined as a second thickness in the first direction.

In one embodiment provided by the present application, the first thickness ranges from 1 micron (μm) to 2.5 μm, and the second thickness ranges from 1 μm to 2.5 μm.

In one embodiment provided by the present application, the OLED display panel further comprises a passivation layer disposed on a side of the planarization layer adjacent to the base substrate, wherein the passivation layer is made of a material comprising one or a combination of silicon oxide, silicon nitride, or aluminum oxide.

In one embodiment provided by the present application, the OLED display panel further comprises an anode layer disposed on a side of the second planarization layer facing away from the base substrate, wherein the anode layer has a structure comprising one of indium tin oxide (ITO)/silver (Ag)/ITO, Ag/ITO, aluminum (Al)/tungsten oxide (WOx), or Ag/indium zinc oxide (IZO).

In one embodiment provided by the present application, the array substrate comprises a buffer layer, a light shielding layer, an active layer, a gate insulation layer, a gate layer, an intermediate dielectric layer, and a source/drain layer.

In one embodiment provided by the present application, the buffer layer is made of a material comprising one of silicon oxide, silicon nitride, or aluminum oxide.

In one embodiment provided by the present application, the active layer is made of a material comprising one of indium gallium zinc oxide, indium zinc oxide, or indium zinc tin oxide.

The present application further provides a method of manufacturing an organic light-emitting diode (OLED) display panel, the method comprising S10: providing a base substrate, and forming a plurality of film layers sequentially in a stacked arrangement on a side of the base substrate in a first direction, wherein the film layers comprise a passivation layer; S20: forming a first planarization layer on a side of the passivation layer facing away from the base substrate, and curing the first planarization layer; S30: forming a second planarization layer on a side of the first planarization layer facing away from the base substrate, and forming a plurality of via holes and a pattern in a non-display area through a halftone mask technology; S40: forming an indium tin oxide (ITO) film on a side of the second planarization layer facing away from the base substrate, and forming a bonding pad in the non-display area by patterning the ITO film; S50: forming an anode reflective film on the side of the second planarization layer facing away from the base substrate, and forming an anode layer by patterning the anode reflective film; and S60: defining a light-emitting area by depositing two embankment corners on two sides of the anode layer in a second direction on the side of the second planarization layer facing away from the base substrate.

In one embodiment provided by the present application, a material of the embankment corners is a hydrophobic organic photoresist.

In one embodiment provided by the present application, the forming the plurality of via holes and the pattern in the non-display area through the halftone mask technology comprises S301: performing an ashing treatment by introducing oxygen to the side of the first planarization layer facing away from the base substrate to facilitate formation of the via holes on the first planarization layer; S302: etching, using a same mask, a first via hole in a display area and a second via hole in a non-display area on the side of the second planarization layer facing away from the base substrate such that the first via hole and the second via hole pass through the second planarization layer; and S303: introducing oxygen again and continuously etching the first via hole and the second via hole such that the first via hole and the second via hole pass through the first planarization layer.

Compared with the prior art, the OLED display panel and the method of manufacturing the same provided by the present application has advantageous effects as follows: 1. the OLED display panel of the present application provides two planarization layers functioning as a two-layer planarization structure and made of different materials to improve flatness of the planarization layers, without increasing an entire thickness of a planarization layer structure, and 2. the method of manufacturing the OLED display panel of the present application concurrently form the first via hole in the display area and a second via hole in the non-display area in a same mask process, so that number of times of using the mask process can be reduced, as well as saving raw material consumption and costs.

DESCRIPTION OF PREFERRED EMBODIMENTS

Figure 1:
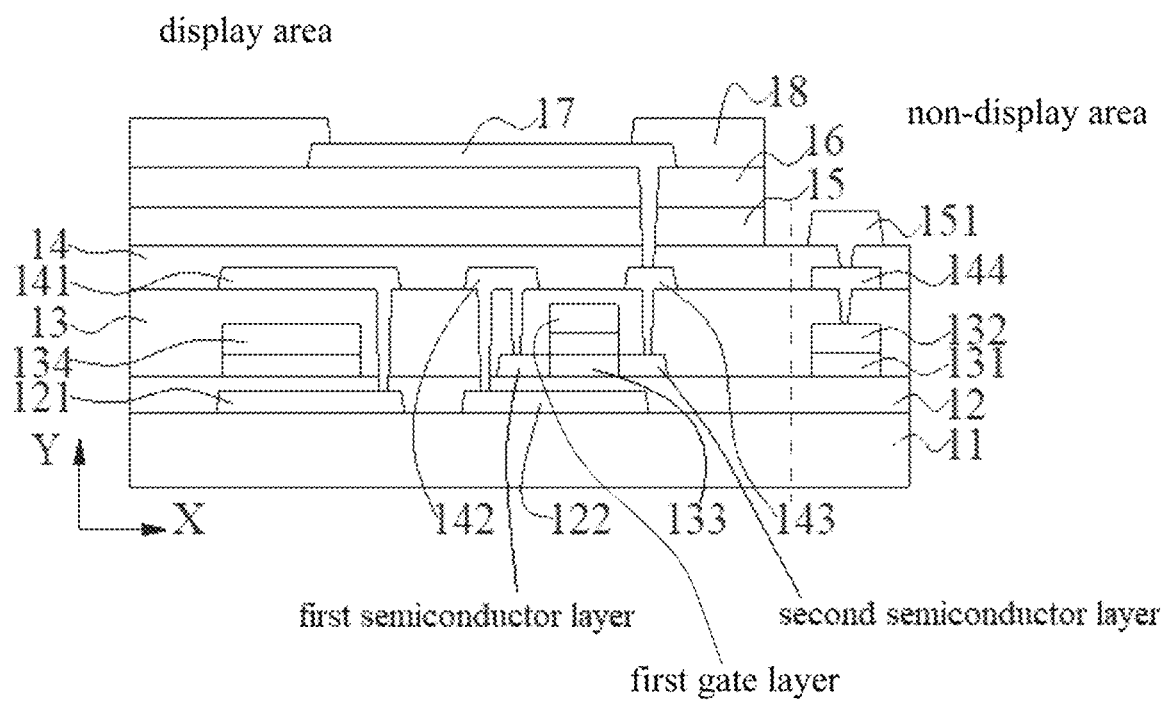
FIG. 1 is a schematic structural view of an organic light-emitting diode (OLED) display panel provided by an embodiment of the present application.

The technical solutions in the embodiments of the present application will be clearly and completely described in the following with reference to the accompanying drawings in the embodiments. It is apparent that the embodiments as described are only a part, but not all, of the embodiments of the present application. Based on the embodiments in the present application, all other embodiments obtained by those skilled in the art without creative efforts shall be within the scope of the present application.

In the description of the present, it is to be understood that the term "center", "longitudinal", "lateral", "length", "width", "thickness", "upper", "lower", "front", "rear", "left", "right", "vertical", "horizontal", "top", "bottom", "inner", "outer", "clockwise", "counterclockwise" indicates orientation or the orientation or positional relationship based on the positional relationship shown in the drawings, for convenience of description only and the present application is to simplify the description, but does not indicate or imply that the device or element referred to must have a particular orientation in a particular orientation construction and operation, and therefore not be construed as limiting the present application. Moreover, the terms "first" and "second" and the like are used for descriptive purposes only and are not to be construed as indicating or implying relative importance. Thus, features defining "first" or "second" may include one or more of the described features either explicitly or implicitly. In the description of the present application, the meaning of "a plurality" is two or more unless specifically and specifically defined otherwise.

The present application provides an organic light-emitting diode (OLED) display panel and a method of manufacturing the same. Please refer to FIGS. 1 to 9 for details.

There are high requirements on flatness of backplates for current top-emission inkjet printing (IJP) technologies, and a planarization layer is generally used to fill in unevenness caused by components and wirings. As users' requirements for display panel resolution, aperture rates, and refresh frequencies are gradually increasing, requirements for metal trace resistance are also getting higher and higher, resulting in a gradual increase in metal trace thickness. However, flattening effects provided by the planarization layer are limited. Therefore, the present application provides an organic light-emitting diode (OLED) display panel and a method of manufacturing the same to solve the above-mentioned problems.

Please refer to FIG. 1 showing a schematic structural view of an OLED display panel provided by an embodiment of the present application.

The present application provides an OLED display panel, including a base substrate 11 and a plurality of film layers sequentially deposited on a side of the base substrate 11 in a stacked arrangement in a first direction Y. The plurality of film layers include a first planarization layer 15 configured to initially planarize an array substrate; and a second planarization layer 16 configured to further planarize the array substrate. The first planarization layer 15 and the second planarization layer 16 are made of different materials. Unlike conventional display panels configured with only one planarization layer, the present application provides a planarization layer having a two-layer structure, such that the first planarization layer 15 and the second planarization layer 16 are made of different materials, greatly improving flatness of the planarization layer.

In one embodiment, a material of the first planarization layer 15 is one of a polyimide (PI)-based organic material or acrylic-based organic material, and a material of the second planarization layer 16 is a siloxane-based organic photoresist material.

In one embodiment, the second planarization layer 16 includes components containing carbon, silicon, oxygen, and hydrogen.

In one embodiment, the first planarization layer 15 has a predetermined thickness defined as a first thickness H1 in the first direction, and the second planarization layer 16 has a predetermined thickness defined as a second thickness H2 in the first direction Y.

Further, the first thickness H1 ranges from 1.0 micron (μm) to 2.5 μm, and the second thickness ranges from 1.0 μm to 2.5 μm.

In one embodiment, the OLED display panel further includes a passivation layer 14 disposed on a side of the planarization layer adjacent to the base substrate 11, wherein the passivation layer 14 is made of a material including one or a combination of silicon oxide, silicon nitride, or aluminum oxide.

In one embodiment, the OLED display panel includes an anode layer 17 disposed on a side of the second planarization layer 16 facing away from the base substrate, wherein the anode layer 17 has a structure including one of indium tin oxide (ITO)/silver (Ag)/ITO, Ag/ITO, aluminum (Al)/tungsten oxide (WOx), or Ag/indium zinc oxide (IZO).

Further, the array substrate includes a first bottom gate electrode, a light-shielding layer 122, a first top gate electrode, a source electrode layer 142, a first drain metal layer 143, a second top gate electrode, and a second drain metal layer 144, wherein all the above-mentioned film layers are made of a material including at least one of molybdenum, aluminum, titanium, or copper. The array substrate further includes: a buffer layer 12, an active layer 133, a gate insulating layer 131, a gate layer 132, an interlayer dielectric layer 13, a source/drain layer, and an indium tin oxide layer 151. Specifically, the base substrate 11 is one of a glass substrate or a flexible substrate. The buffer layer 12 is made of a material including one of silicon oxide, silicon nitride, or aluminum oxide. The active layer 133 is made of a material including one of indium gallium zinc oxide, indium zinc oxide, or indium zinc tin oxide. The gate insulating layer 131 is made of a material including one of silicon oxide, silicon nitride, or aluminum oxide. The source electrode layer 142 and the first drain metal layer 143 are made of a material including one of molybdenum (Mo), aluminum (Al), copper (Cu), or titanium (Ti). The interlayer dielectric layer is made of a material including one of silicon oxide, silicon nitride, or aluminum oxide.

Further, a first sub-storage capacitor 121 is disposed on a side of the base substrate 11, and a second sub-storage capacitor 134 and a third sub-storage capacitor 141 are disposed on a side of the first sub-storage capacitor 121 facing away from the base substrate 11. The second sub-storage capacitor 134 and the first sub-storage capacitor 121 cooperatively form a first storage capacitor, and the second sub-storage capacitor 134 and the third sub-storage capacitor 141 cooperatively form a second storage capacitor. Since the first sub-storage capacitor 121 and the third sub-storage capacitor 141 are electrically connected to each other through a via hole, a capacitance value of a storage capacitor of the OLED display panel is a sum of a capacitance value of the first storage capacitor and a capacitance value of the second storage capacitor. In this manner, it can not only increase the capacitance value of the storage capacitor, but also reach a best value of the sum of the capacitance values of the first storage capacitor and the second storage capacitor through adjustment of a thickness of a first dielectric layer and a second dielectric layer, thereby enabling the display panel to keep brightness unchanged within one frame time and providing a stable picture. Please refer to FIG. 9, the present application further provides a method of manufacturing an OLED display panel, including the following steps:

Step S10: providing a base substrate 11, and forming a plurality of film layers sequentially in a stacked arrangement on a side of the base substrate 11 in a first direction Y, wherein the film layers include a passivation layer 14.

Figure 2:
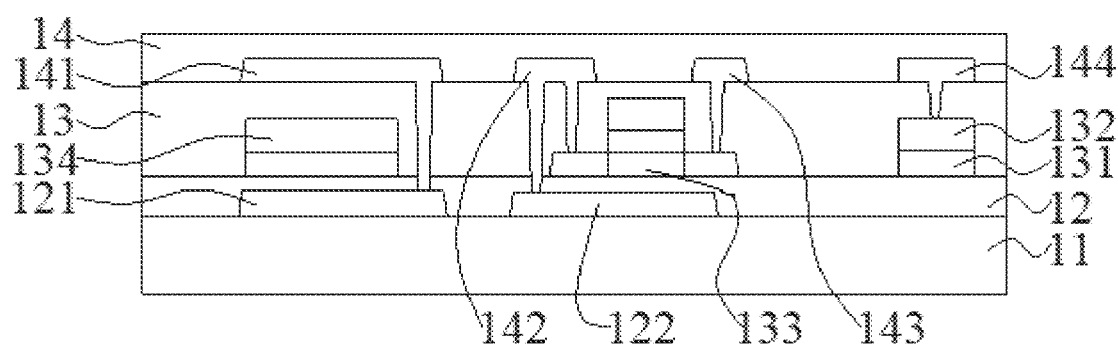
FIG. 2 is a first process flow diagram illustrating a method of manufacturing the OLED display panel provided by an embodiment of the present application.

Specifically, please refer to FIG. 2. First, provide the base substrate 11, and the base substrate 11 is one of a glass substrate or a flexible substrate. Next, deposit a first metal layer on the base substrate 11, wherein the first metal layer is made of a material including one of molybdenum (Mo), aluminum (Al), copper (Cu), or titanium (Ti). Form a first bottom gate electrode and a light-shielding layer 122 by patterning the first metal layer through a first mask. A buffer layer 12 is prepared on the base substrate 11 by a chemical vapor deposition method or a sputtering method. The buffer layer 12 completely covers the first bottom gate electrode and the light-shielding layer 122. Next, a semiconductor layer, a gate insulating layer 131, and the first metal layer are sequentially formed on the buffer layer 12. Then, a semiconductor pattern region is formed on the buffer layer 12 by using a halftone mask as a second mask (that is, part of the semiconductor layer, part of the gate insulating layer 131, and part of the first metal layer outside the semiconductor pattern region are etched away by wet etching, dry etching, and wet etching, respectively). Then, regions of the source electrode 142 and the drain electrode 143, the gate insulating layer 131, and part of the first metal layer are ashed away, so that a first top gate electrode and a second top gate electrode are formed (that is, part of the first metal layer and part of the gate insulating layer 131 in source and drain regions are etched away by wet etching and dry etching, respectively). Then, a first semiconductor layer, a second semiconductor layer, a first gate insulating layer 131, a second gate insulating layer, a first top gate electrode 132, and a second top gate electrode are formed on the buffer layer 12. The first gate insulating layer 131 and the first top gate electrode 132 are disposed in a non-display area, and the second gate insulating layer and the second top gate electrode are disposed in a display area. Specifically, the buffer layer 12, the first gate insulating layer 131, and the second gate insulating layer are made of a material including at least one of silicon dioxide, silicon nitride, and aluminum oxide. In this manner, the gate insulating layer so formed has better insulation performance, which can prevent the gate electrode from contacting the active layer 133 thereon, avoid short circuits, and reduce product performance. The first semiconductor layer and the second semiconductor layer are made of a material including at least one of indium zinc oxide (IZO) and indium zinc tin oxide (IZTO). The first top gate electrode and the second top gate electrode are made of a material including at least one of Mo, Al, Ti, and Cu.

An interlayer dielectric layer 13 is prepared on the buffer layer 12 by a chemical vapor deposition method or a sputtering method. The interlayer dielectric layer 13 completely covers the first semiconductor layer, the second semiconductor layer, the first gate insulating layer 131, the second gate insulating layer, the first top gate electrode 132, and the second top gate electrode. A material of the interlayer dielectric layer 13 is at least one of silicon dioxide, silicon nitride, or aluminum oxide. Then, use a halftone mask as a third mask to etch an upper part of an opening area of the buffer layer 12 (at this time, part of the opening area of the buffer layer 12 will be etched into the interlayer dielectric layer 13), and ash the opening area corresponding to the interlayer dielectric layer 13. Specifically, the opening area corresponding to the interlayer dielectric layer 13 includes areas above the source electrode 142, the drain electrode 143, and the first top gate electrode 132. When the interlayer dielectric layer 13 is etched in the second time etching process, a portion of the buffer layer 12 corresponding to the opening area will also be etched away, so that source and drain electrode regions of three thin-film transistors, the light-shielding layer 122, the first top gate electrode 132, and the first bottom gate electrode (not shown) are exposed. That is, a first via hole, a second via hole, a third via hole, a fourth via hole, and a fifth via hole are formed on the interlayer dielectric layer 13 using a halftone mask as the third mask. The first via hole exposes the first bottom gate electrode, the second via hole exposes the first semiconductor layer, the third via hole exposes the first top gate electrode, the fourth via hole exposes the second semiconductor layer, and the fifth via hole exposes the light-shielding layer 122.

A second metal layer is deposited on the interlayer dielectric layer 13. The second metal layer is patterned through a fourth mask to form a source electrode layer 142, a first drain metal layer 143, and a second drain metal layer 144. A right end of the source electrode layer 142 and the first drain metal layer 143 are electrically connected to the first and second semiconductor layers through the second via hole and the fourth via hole, respectively. The second drain metal layer 144 is electrically connected to the first top gate electrode 132 through the third via hole. A left end of the source electrode 142 is electrically connected to the light-shielding layer 122 through the fifth via hole. A passivation layer 14 is prepared on the interlayer dielectric layer 13 by a chemical vapor deposition method or a sputtering method. The passivation layer 14 completely covers the source electrode layer 142, the first drain metal layer 143, and the second drain metal layer 144. A material of the passivation layer 14 is at least one of silicon dioxide, silicon nitride, or aluminum oxide. The active layer 133 may be made of a material containing an amorphous oxide semiconductor material, and specifically can be one or more of IGZO, IZO, and IZTO.

Step S20: forming a first planarization layer 15 on a side of the passivation layer 14 facing away from the base substrate 11, and curing the first planarization layer.

Figure 3:
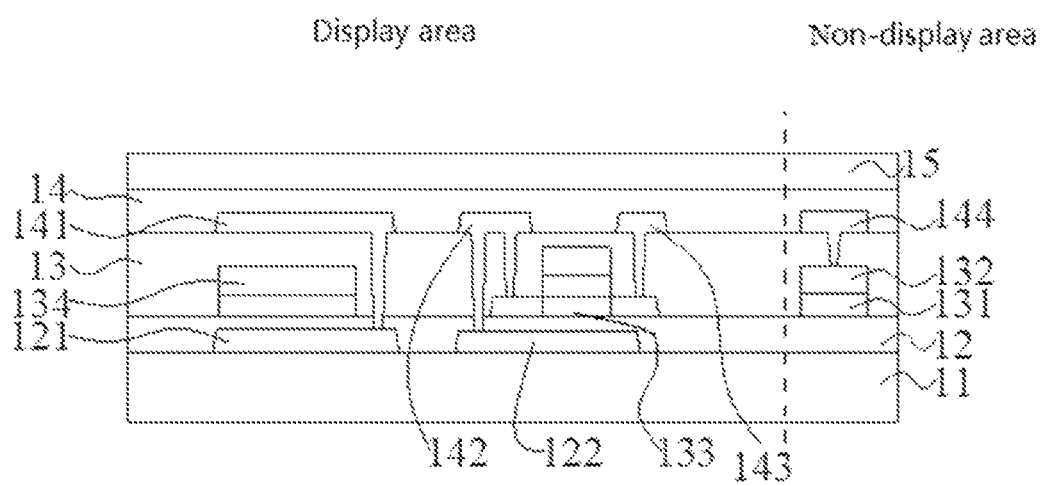
FIG. 3 is a second process flow diagram illustrating the method of manufacturing the OLED display panel provided by an embodiment of the present application.

Please refer to FIG. 3 showing a second process flow diagram illustrating the method of manufacturing the OLED display panel provided by an embodiment of the present application. An oxide metal layer is formed on a side of the non-display area of the passivation layer 14 away from the base substrate 11. The oxide metal layer is made of ITO. Then, the oxide metal layer is patterned through a mask to form a pixel electrode. The pixel electrode is electrically connected to the bottom gate electrode through the first via hole, electrically connected to the top gate electrode through the third via hole, and electrically connected to the drain metal layer 143 through the sixth via hole, so that the array substrate is fabricated.

Step S30: forming a second planarization layer 16 on a side of the first planarization layer 15 facing away from the base substrate 11, and forming a plurality of through holes and a pattern in a non-display area through a halftone mask technology.

Figure 4:
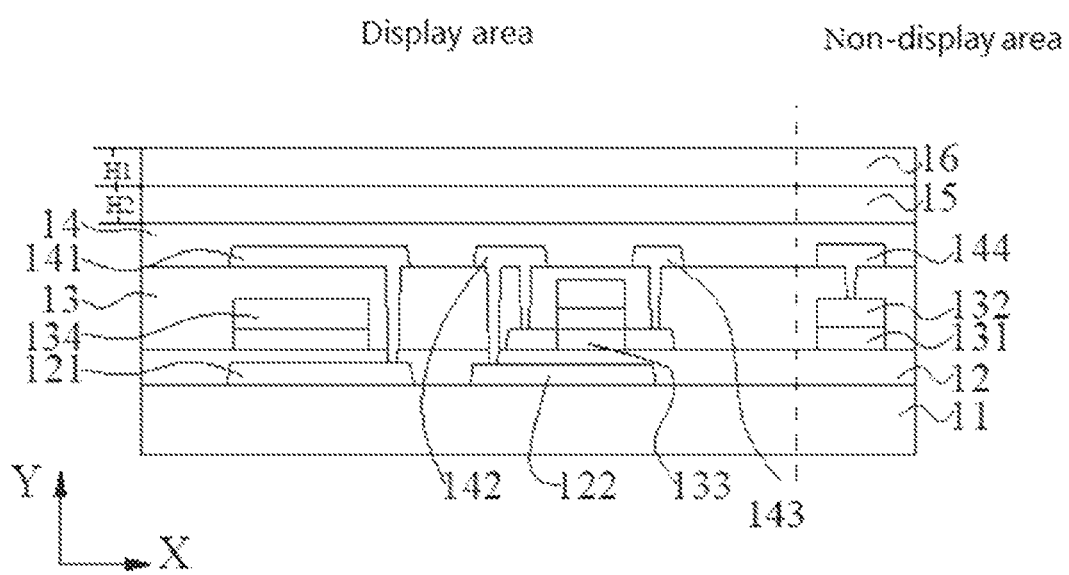
FIG. 4 is a third process flow diagram illustrating the method of manufacturing the OLED display panel provided by an embodiment of the present application.

Please refer to FIG. 4 showing a third process flow diagram illustrating the method of manufacturing the OLED display panel provided by an embodiment of the present application. The first planarization layer and the second planarization layer have a same area, and cover a same area of the array substrate. In addition, each of the first planarization layer and the second planarization layer has an orthographic projection projected to a same position in the first direction.

Step S40: forming an ITO film on a side of the second planarization layer 16 facing away from the base substrate 11, and forming a bonding pad in the non-display area by patterning the ITO film.

Figure 5:
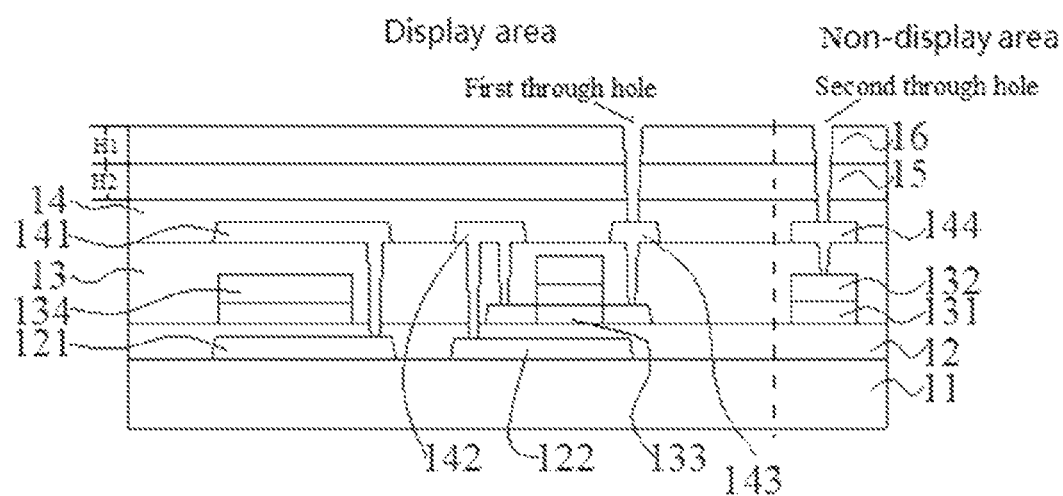
FIG. 5 is a fourth process flow diagram illustrating the method of manufacturing the OLED display panel provided by an embodiment of the present application.
Figure 6:
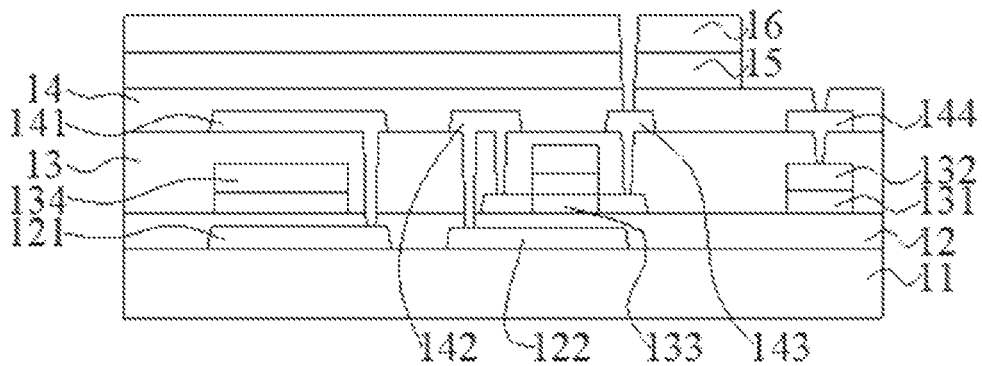
FIG. 6 is a fifth process flow diagram illustrating the method of manufacturing the OLED display panel provided by an embodiment of the present application.

Please refer to FIGS. 5 and 6 showing a fourth process and a fifth process flow diagram illustrating the method of manufacturing the OLED display panel provided by an embodiment of the present application.

Step S50: forming an anode reflective film on the side of the second planarization layer 16 facing away from the base substrate, and forming an anode layer by patterning the anode reflective film.

Figure 7:
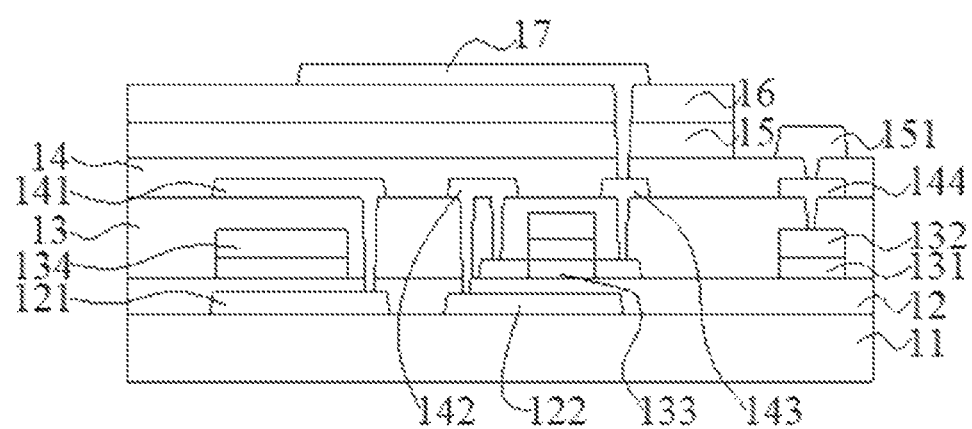
FIG. 7 is a sixth process flow diagram illustrating the method of manufacturing the OLED display panel provided by an embodiment of the present application.

Please refer to FIG. 7 showing a sixth process flow diagram illustrating the method of manufacturing the OLED display panel provided by an embodiment of the present application. An anode formed according to the anode layer has a length in a second direction less than a length of the first planarization layer or a length of the second planarization layer in the second direction. An area of the array substrate covered by the anode is less than an area of the array substrate covered by the first planarization layer or by the second planarization layer. The anode has an orthographic projection area in the first direction less than an orthographic projection area of the first planarization layer or the second planarization layer in the first direction.

Step S60: defining a light-emitting area by depositing two embankment corners 18 on two sides of the anode layer 17 in a second direction X on the side of the second planarization layer 16 facing away from the base substrate 11.

Figure 8:
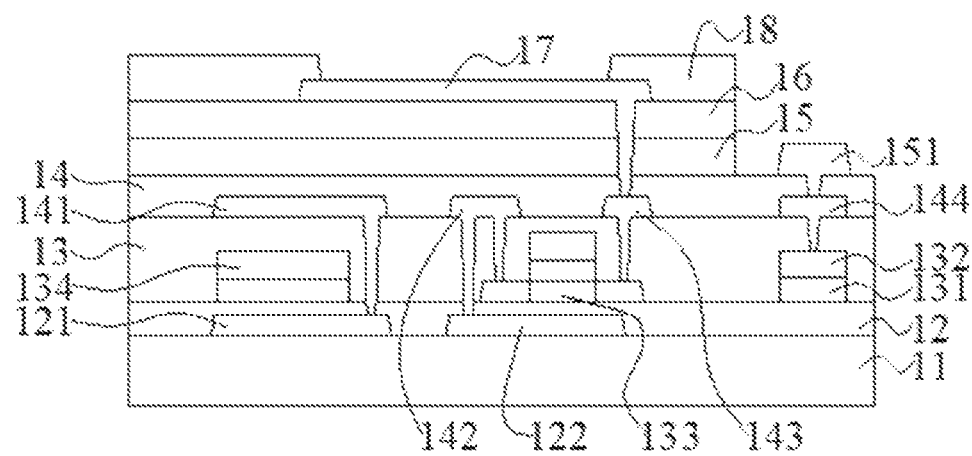
FIG. 8 is a seventh process flow diagram illustrating the method of manufacturing the OLED display panel provided by an embodiment of the present application.
Figure 9:
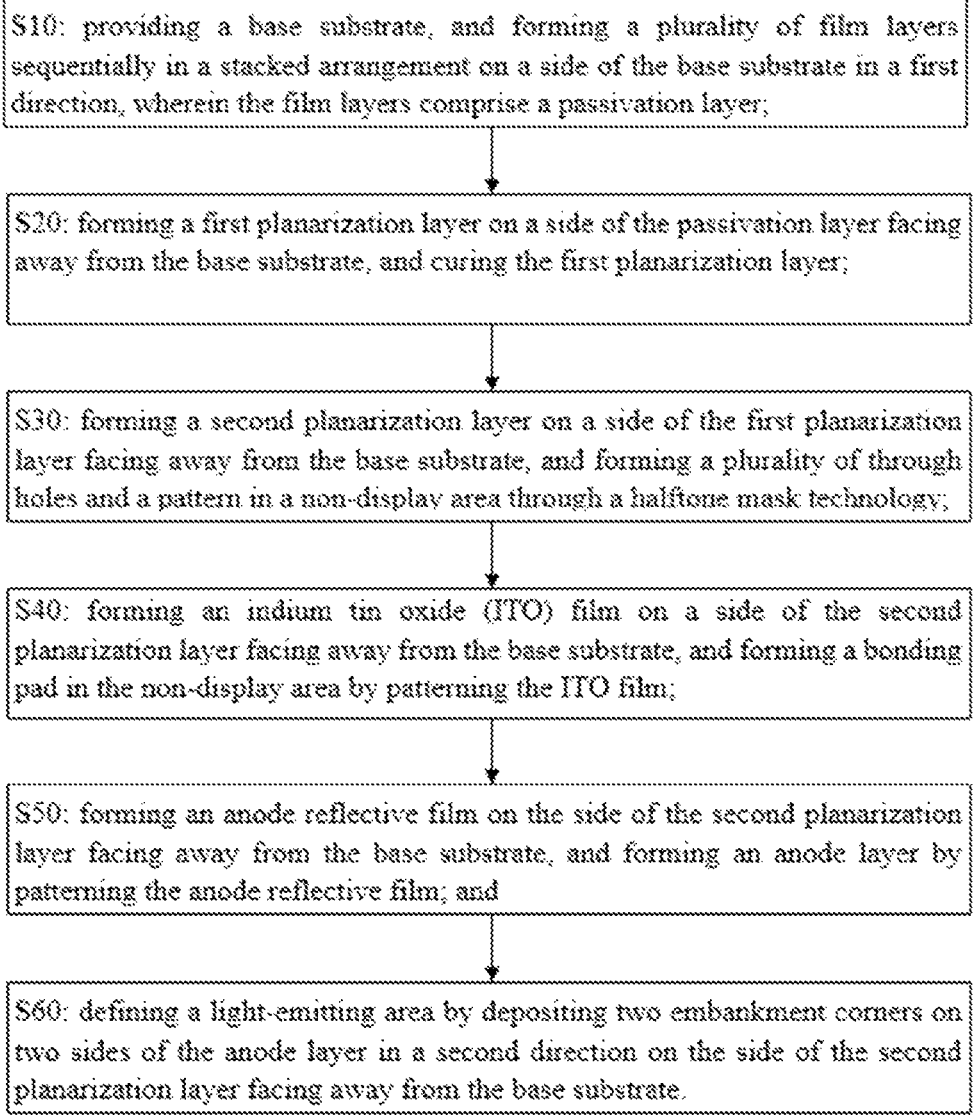
FIG. 9 is a flowchart illustrating a method of manufacturing an OLED display panel provided by an embodiment of the present application.

Please refer to FIG. 8 showing a seventh process flow diagram illustrating the method of manufacturing the OLED display panel provided by an embodiment of the present application.

In one embodiment, the embankment corners 18 are made of a hydrophobic organic photoresist.

In one embodiment, the step of forming the plurality of via holes and the pattern in the non-display area through the halftone mask technology includes:

Step S301: performing an ashing treatment by introducing oxygen to the side of the first planarization layer 15 facing away from the base substrate 11 to facilitate formation of holes on the first planarization layer 15;

Step S302: etching, using a same mask, the first through hole in the display area and the second through hole in the non-display area on the side of the second planarization layer 16 facing away from the base substrate 10 such that the first through hole and the second through hole pass through the second planarization layer 16;

Step S303: introducing oxygen again and continuously etching the first through hole and the second through hole such that the first through hole and the second through hole pass through the first planarization layer 15.

Accordingly, the OLED display panel and the method of manufacturing the same provided by the present application has advantageous effects as follows: the OLED display panel of the present application provides two planarization layers functioning as a two-layer planarization structure and made of different materials to improve flatness of the planarization layers, without increasing an entire thickness of a planarization layer structure, and the method of manufacturing the OLED display panel of the present application concurrently form the first via hole in the display area and a second via hole in the non-display area in a same mask process, so that number of times of using the mask process can be reduced, as well as saving raw material consumption and costs.

The OLED display panel and the method of manufacturing the same provided by the embodiments of the present application are described in detail above. In this article, specific examples are used to explain the principles and implementation of this application, and the description of the above embodiments is only used to help understand the technical solutions and core ideas of this application. Those of ordinary skill in the art should understand that they can still modify the technical solutions described in the foregoing embodiments, whereas these modifications or substitutions do not deviate the essence of the corresponding technical solutions from the scope of the technical solutions of the embodiments provided by the present applications.

What is claimed is:

1. A method of manufacturing an organic light-emitting diode (OLED) display panel, the method of manufacturing the OLED display panel comprising:
   S10: providing a base substrate, and forming a plurality of film layers sequentially in a stacked arrangement on a side of the base substrate in a first direction, wherein the film layers comprise a passivation layer;
   S20: forming a first planarization layer on a side of the passivation layer facing away from the base substrate, and curing the first planarization layer;
   S30: forming a second planarization layer on a side of the first planarization layer facing away from the base substrate, and forming a plurality of via holes and a pattern in a non-display area through a halftone mask technology, wherein the forming the plurality of via holes and the pattern in the non-display area through the halftone mask technology comprises:
   S301: performing an ashing treatment by introducing oxygen to the side of the first planarization layer facing away from the base substrate to facilitate formation of holes on the first planarization layer;
   S302: etching, using a same mask, a first through hole in a display area and a through via hole in a non-display area on the side of the second planarization layer facing away from the base substrate such that the first through hole and the second through hole pass through the second planarization layer; and
   S303: introducing oxygen again and continuously etching the first through hole and the second through hole such that the first through hole and the second through hole pass through the first planarization layer;
   S40: forming an indium tin oxide (ITO) film on a side of the second planarization layer facing away from the base substrate, and forming a bonding pad in the non-display area by patterning the ITO film;
   S50: forming an anode reflective film on the side of the second planarization layer facing away from the base substrate, and forming an anode layer by patterning the anode reflective film; and
   S60: defining a light-emitting area by depositing two embankment corners on two sides of the anode layer in a second direction on the side of the second planarization layer facing away from the base substrate.

2. The method of manufacturing the OLED display panel of claim 1, wherein a material of the embankment corners is a hydrophobic organic photoresist.

* * * * *